*INVENTOR.*
JOHN V. McMILLIN
*BY*
Brown, Schuyler & Beveridge
ATTORNEYS

SELECTIVELY CONTROLLED TRANSISTOR DISCRIMINATOR CIRCUITS

Filed April 6, 1966 4 Sheets-Sheet 2

INVENTOR.
JOHN V. McMILLIN
BY
Brown, Schuyler & Beveridge
ATTORNEYS

INVENTOR.
JOHN V. McMILLIN
BY
Browne, Schuyler & Beveridge
ATTORNEYS

SELECTIVELY CONTROLLED TRANSISTOR DISCRIMINATOR CIRCUITS

Filed April 6, 1966 4 Sheets-Sheet 4

*INVENTOR.*
JOHN V. McMILLIN
*BY*
Browne, Schuyler & Beveridge
ATTORNEYS 3,486,040

SELECTIVELY CONTROLLED TRANSISTOR DISCRIMINATOR CIRCUITS

John V. McMillin, Iowa City, Iowa, assignor to Measurement Research Center, Inc., Iowa City, Iowa, a nonprofit corporation of Iowa Filed Apr. 6, 1966, Ser. No. 540,700
Int. Cl. H03k 5/20
U.S. Cl. 307—235 10 Claims

ABSTRACT OF THE DISCLOSURE

Selectively controlled transistor discriminator circuits in which a plurality of parallel transistors corresponding in number to the number of input signals, each have a collector load resistor, emitter resistor and a common ratio resistor, the ratio of emitter resistance in the emitter circuit to the ratio resistor defines a discrimination ratio. Silicon transistors are used and the dynamic range of the circuit is increased by utilization of a series silicon diode having a much higher breakdown voltage in the base emitter circuit of the transistor. Such diodes are preferably located in series with the emitter resistor and a nodal junction of the emitter resistors and the ratio resistor, so that these diodes may be utilized to switch the discrimination fields into various sized groups or sets and serves the dual purpose of increasing the dynamic range of the circuit and providing automatic electronic switching or selection of discrimination fields or sets. Circuitry is also included for strobing or scanning each discriminator transistor output into a storage device which may be used to feed computer or other utilization device. Consult the specification for further features and details.

This invention relates to discriminator circuits and controls therefor and, more specifically, to a discriminator circuit which selects from a plurality of input signals one signal having a predetermined value above a selected ratio wherein the selection is independent of the relative values of the input signals.

The invention is particularly adapted for use with manually marked data records on paper documents bearing information such as answers to standardized objective tests, census surveys, market surveys, inventory additions and withdrawals, etc., and the mechanized reading of such data. A preferred embodiment or application of the invention is for use in automated optical scanning of position-coded pencil-marked information from paper documents as generally disclosed in Lindquist Patent 3,050,248 issued Aug. 21, 1962, entitled "Methods and Apparatus for Processing Data."

A practical difficulty in the mechanized reading of such documents is the fact that the density, opacity, blackness or readability of marks made under controlled conditions in the field is extremely variable. Pencils used may vary widely in hardness and the consequent darkness or readability of the marks made with them will likewise vary. The characteristics of people making pencil marks on the document will vary from the individual who grinds a very dense black mark into the paper to one who gently, artistically shades in a response or marking position. Dots, *x*'s, check marks and zeros are often used by individuals to mark a selected response. In addition, the individual marking the document sometimes has dirty or greasy hands and often makers erasures very carelessly and incompletely.

The present invention provides accurate reading of these extremely variable marks by comparing mark densities on a relative basis rather than by setting a fixed "go-no-go" threshold. The circuit of the present invention can make such relative density comparisons and selections for marks ranged horizontally, vertically or even from an area.

In addition, in cases where two or more marks in a single discrimination set are equally (a predetermined range of densities can be defined to the device as "equal") dense, black or readable, will identify with a unique signal or code, the portion of the document which will require human scrutiny to resolve the dilemma.

The invention may be applied where parameters such as voltages, currents, pressures, light intensities, temperatures, stresses, weights, volumes, etc., are to be compared with the largest value selected from a given set.

Briefly described, the invention includes a plurality of parallel transistors corresponding to the number of input signals, each such input signal being in the form of a time-varying voltage inputs varying in amplitude in accordance with a given parameter. There is a collector load resistor and an emitter resistor for each of the transistors and a ratio resistor commonly connected in series with each emitter resistor with the common point of all emitter resistors and the ratio resistor defining a nodal point. The ratio of emitter resistance in the emitter circuit to the ratio resistor defines the discrimination ratio so that the discrimination function performed by the circuit is unaffected by the absolute voltage level of one or more of the input voltages and an output appears only on a transistor collector electrode where the input voltage applied thereto is at least a selected ratio above the remaining input voltages. Preferably, the transistors are high sensitivity, low leakage current silicon transistors. Such transistors have a reverse emitter-to-base breakdown voltage in the range of 5–10 volts which limits the dynamic range of the circuit to about less than 10 volts. In order to increase the dynamic range of the circuit, a series diode (preferably silicon) having a much higher breakdown voltage is connected in the base-emitter circuit of each transistor. Although the insertion of such a diode in the base-emitter circuit modifies the effective input levels by a factor corresponding to the forward direction voltage drop of the diode, this does not alter the basis action of the discriminator since it only increases the absolute minimum threshold value by a factory which is proportional to the forward direction voltage drop of the diodes.

The diodes in series with the base-emitter circuit of the transistors may be connected directly between the base circuit and the input terminal thereto. However, in order to utilize the switching function of the diode, it is preferred that such diodes be located in series with the emitter resistor and the node junction or common point of the emitter resistors and the ratio resistor. Since the base currents are quite small, location of the diode in the emitter circuit, where the currents are larger, means that there will be a slightly higher forward voltage drop across the diode. Since this is a relatively small voltage, and the variation therein is between base and emitter circuits, respectively, the effective value of the threshold voltage remains about the same. The location of the diode in the emitter circuit is preferred because it allows automatic electronic switching of the discrimination fields into various size groups or sets, and in fact, the diode is an important part of this switching circuitry. The diode, therefore, serves a dual purpose in the discrimination circuit in increasing the dynamic range of the circuit and providing automatic electronic switching or selection of discrimination fields.

Thus, the conduction condition of the diodes may be selectively controlled so that different ones of a group or groups of transistors may be rendered operative, in which case the diodes operate as voltage-controlled switches. In the preferred embodiment, there are a plurality of separate diodes (sometimes called a "set" hereinafter) for each transistor and a switching circuit for energizing selected ones of the transistors by biasing a selected diode of a set conductive in different arrangements, as described later herein. Thus, certain discriminators may be disabled, or the same discriminator circuit may be used in a number of different field combinations.

A second transistor may be connected as an amplifier and isolator for the output of each transistor. In this case, the collector load resistance of the discriminator transistor preferably is of a relatively high resistance to serve as a clamp for the collector circuit of the discriminator transistors and the base circuit of the isolating and amplifying transistor circuits.

A further aspect of the invention includes circuitry for strobing or scanning each discriminator circuit and the output of same into a storage device such as a flip-flop, which in turn feeds the output into the logic circuitry for feeding into, say a computer or other utilization device.

The basic discriminator circuit as described above is primarily for use in selecting the largest input signal from a series of input signals which may vary in amplitude. In some document processing systems, however, such as the punched-hole type reading systems, there is no need for discrimination as such because there is no ambiguity—a punched hole is either present or absent. In a document processing system with which the present invention is used, an operational amplifier is connected between the sensor and the discriminator circuit and a punched hole produces a negative signal. In this instance, the negative input signal is fed into the emitter circuits of each discriminator circuit and the base is grounded so that the discriminator circuit becomes a grounded base amplifier and responds only to negative inputs at the emitter electrode. In this case, a voltage reference device, such as a Zener diode, may be included in series with the emitter circuit path to set any desired negative detection level.

Other features and advantages in the present invention will become more apparent from the following detailed description taken in conjunction with the attached drawings wherein:

FIGS. 1*a*, 1*b* and 1*c* show horizontal, vertical, and area arrays of information positions, respectively, on a data sheet, such as a manually-marked examination sheet which is to be graded and collated with information from a series of such sheets and shows typical incomplete erasures, smudges, marks, and the like, from which a selected mark is to be detected;

Figure 3:
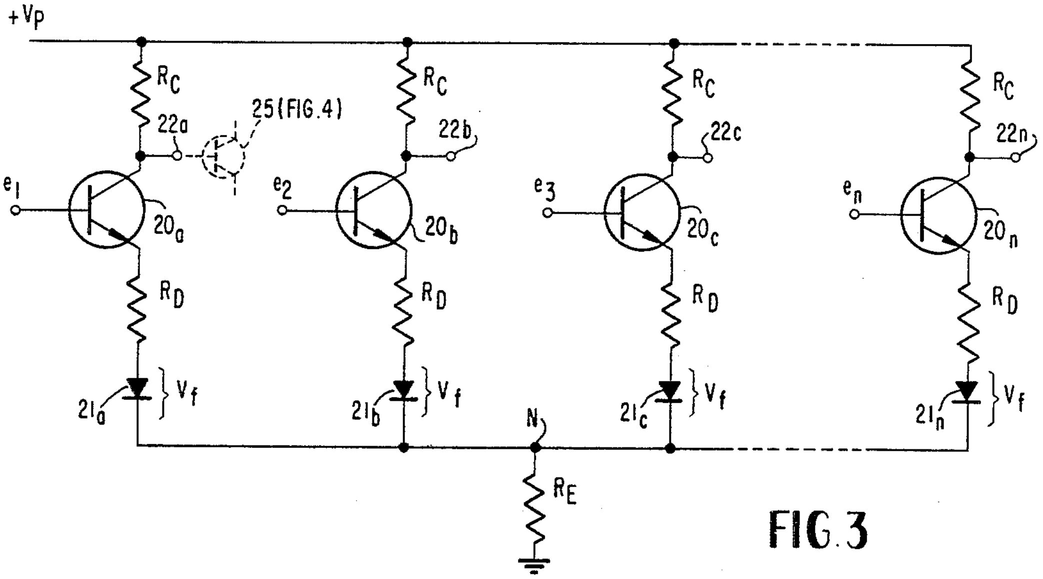
FIG. 3 is a circuit schematic disclosing the basic discriminator circuit of the invention.
Figure 5:
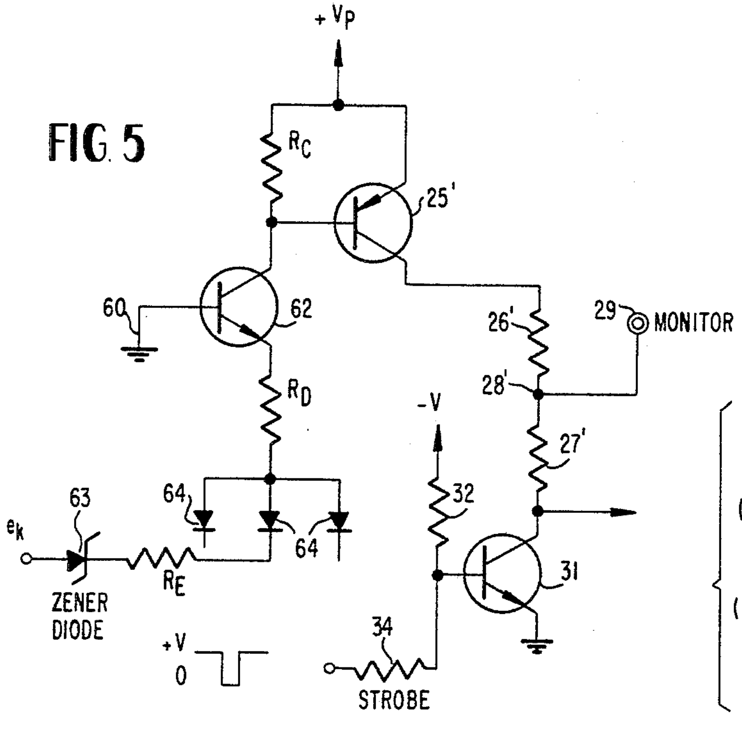
Figure 5A:
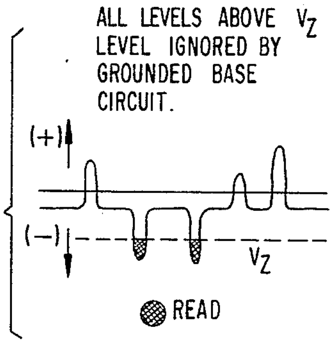
Figure 4:
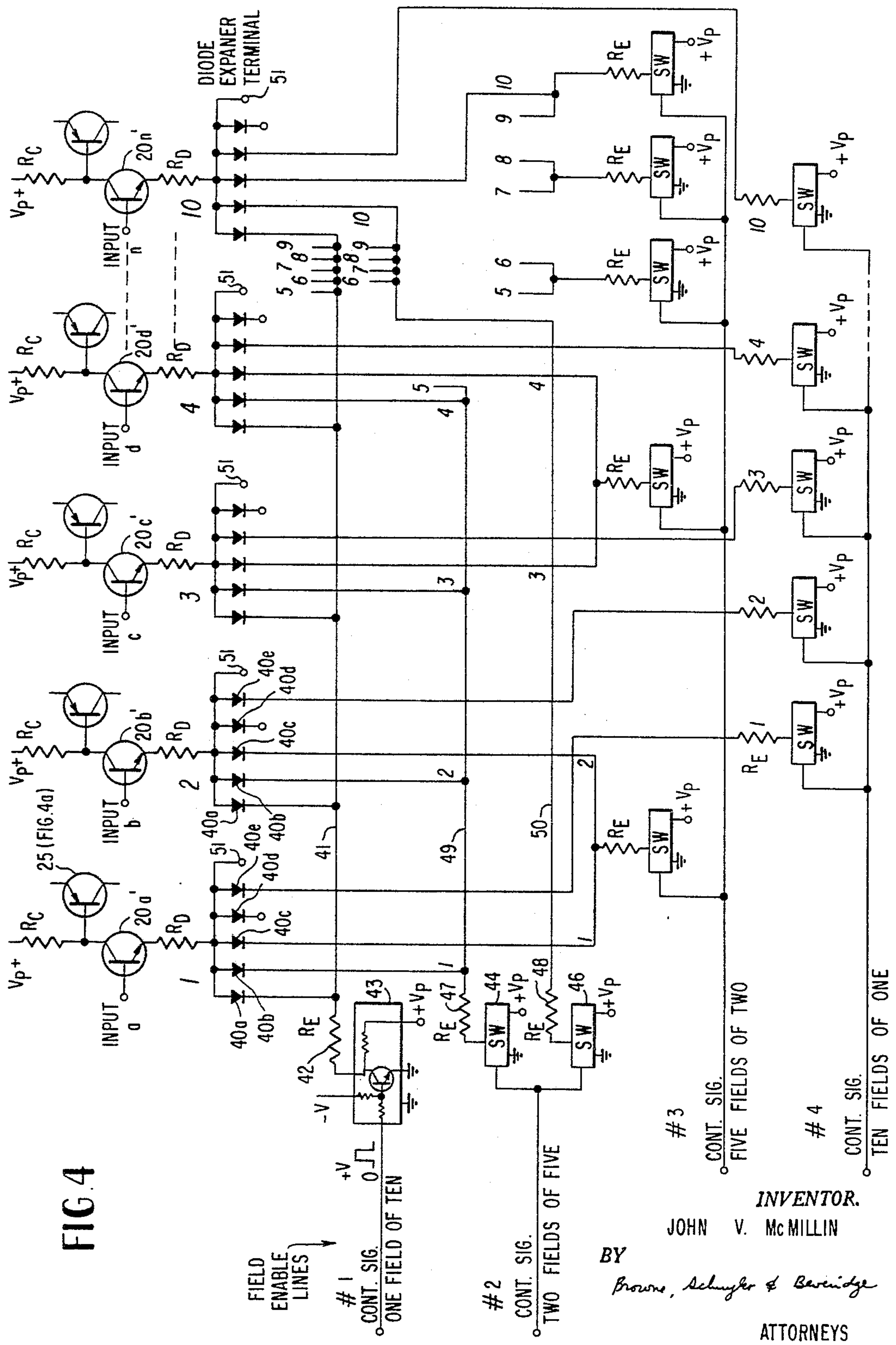
Figure 4A:
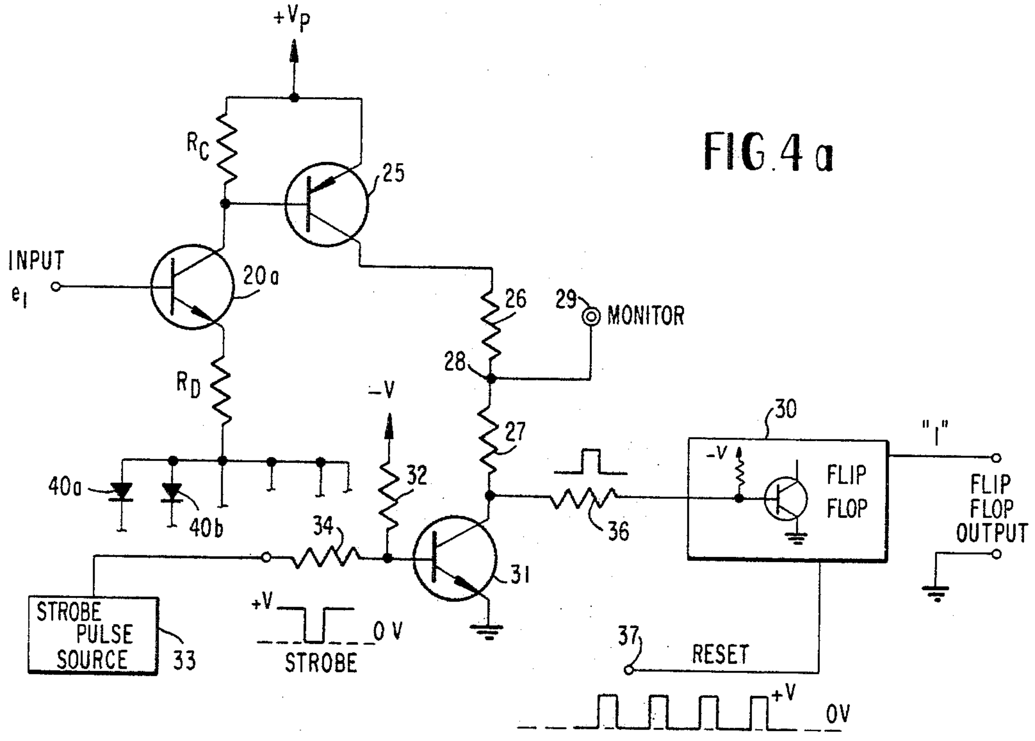
Figure 4B:
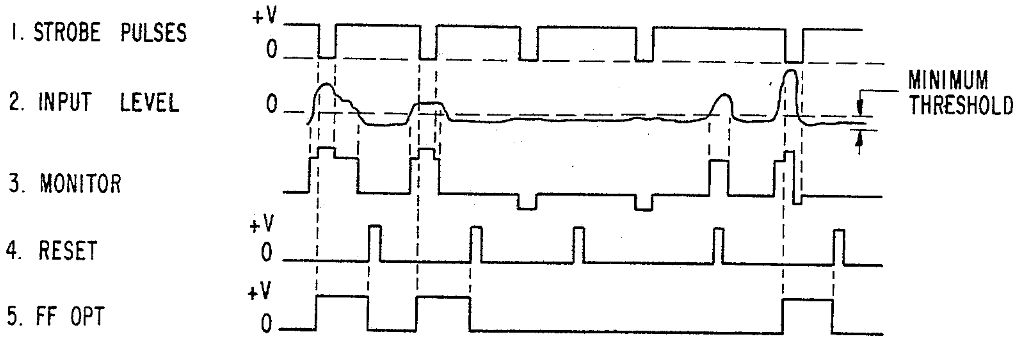

FIG. 4 is a circuit schematic disclosing the circuit of FIG. 3 in an arrangement wherein sets of discriminators may be selected for operation by a switching matrix and further discloses additional circuitry for deriving an output from the discriminator; FIG. 4*a* is a circuit schematic of a preferred output circuit for the discriminator channels and FIG. 4*b* is a waveform diagram reflecting the operation of the circuit shown in FIG. 4*a*; and FIG. 5 is a circuit schematic of a modification of the circuit disclosed in FIG. 3 for discriminating signals from sources in which there may be no ambiguity by reason of variation in amplitude of input signal, and FIG. 5*a* is a waveform diagram reflecting the detecting function.

Figure 1:
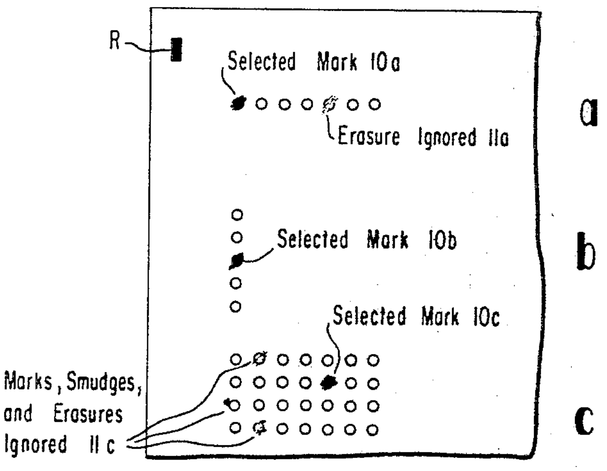

With reference now to FIGS. 1*a*, 1*b* and 1*c* of the drawings, the information positions may be arrayed in horizontal, vertical, or area positions, or various combinations of same on a single data sheet. The invention is particularly concerned with such data sheets wherein there may be a selected mark amongst a series of marks wherein the selected mark has a density of a selected value or percentage above any of the smudge marks, incomplete erasures, and the like. Thus, marks **10*a*, 10*b* and 10*c* will be selected and erasures, smudge marks, and the like, 11*a* and 11*c*** will be ignored. Such document may also have printed thereon a registration index R which is sensed by a set of sensors (not shown) to determine the relative position of information position areas and produce a registration control signal for the switching matrix to activate selected discriminator channels corersponding to the location of the information position areas.

Figure 2:
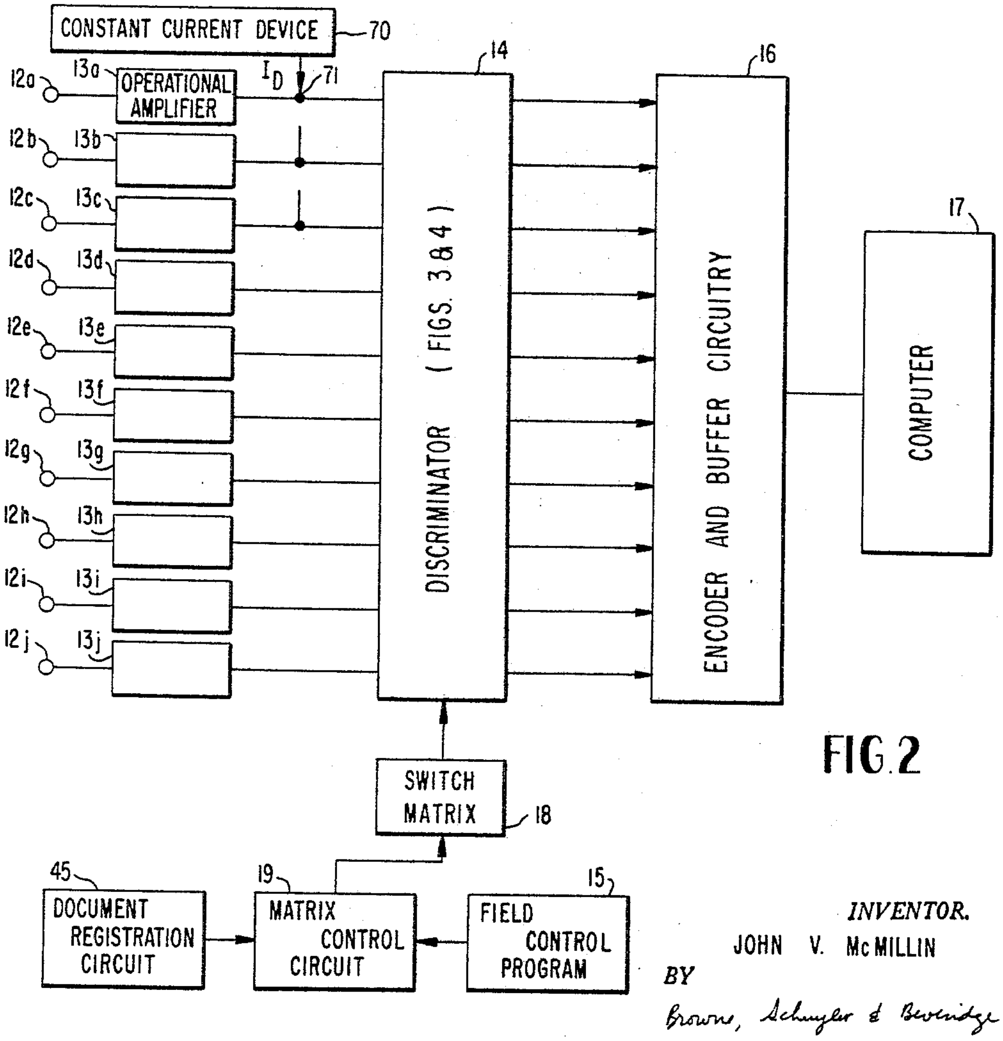
FIG. 2 is a diagrammatic representation of a series of signal sources, which in the disclosed embodiment of the invention are optical scanners such as photo diodes, which may be grouped in any desired spacial and/or group relationship corresponding to the information position pattern on a given document.

With reference now to FIG. 2, optical sensors, such as photo diodes 12, the number of such photo diode 12 corresponding in number at least to the number of possible information positions in an information area on the data sheet and arrayed in horizontal, vertical, or horizontal and vertical rows or combinations thereof and controlled in a manner to be described later herein. For simplicity, only 10 photo diodes 12 or optical sensors are shown in FIG. 2, it being understood that the number thereof may vary in accordance with any desired information sheet and that different ones may be selected for operation at different times. The outputs from the photo diodes are applied to conventional operational amplifiers 13 and the output of each amplifier 13 is applied to the discriminator circuit 14 and the output of the discriminator 14 is applied to an encoding and buffer circuit 16 which delivers its output to a computer 17, such encoder circuit 16 and computer 17 formin gno part of the present invention and may, in general, be similar to the apparatus disclosed in Lindquist Patent 3,050,248. However, it is to be understood that the output of discriminator 14 may be applied to a simple display and/or recording device, not shown.

The discriminator circuit 14 may be itself controlled so as to enable or disable outputs from any of the photo diodes 12 by switching matrix 18 and switching matrix 18 may itself be controlled so that outputs from different ones or different sets of sensors 12 may be delivered to the output of the discriminator. Thus, switching matrix 18 may be controlled by a matrix control circuit 19 which may receive a control signal from document sensors (not shown, but connected to the document registration circuit 45) concerning the information position areas on the data sheet with respect to the path of travel thereof through the device and controls certain ones of said sensors so as to compensate for misregistration thereof. Matrix control circuit 19 may receive programmed signals in accordance with the position information pattern on the document being read as from a field control program source 15.

BASIC DISCRIMINATOR CIRCUIT

With reference now to FIG. 3, the discriminator circuit per se, comprises a plurality of transistors **20*a*, 20*b*, 20*c*, 20*d* . . . 20*n*, each having corresponding base, collector and emitter electrodes and being preferably of the silicon type for high sensitivity and minimum leakage currents. (Although NPN transistors are shown, it is apparent that PNP transistors may be used taking care to observe appropriate polarity conditions.) Each transistor circuit includes a collector load resistor $R_C$ and an emitter resistor $R_D$, the several circuits connected in parallel with each other to a positive supply bus $+V_P$. Although FIG. 3 shows diodes 21*a*, 21*b*, 21*c* . . . 21*n*, for present discussion these diodes will be disregarded. The lower ends of emitter resistors $R_D$ are thus connected to nodal or common point N and between nodal point N and ground is connected ratio resistor $R_E$. Thus ratio resistor $R_E$ is commonly in series with each emitter resistor $R_D$, respectively, so that any voltage developed across ratio resistor $R_E$ combined with any possible current flow through $R_D$ is at each emitter electrode. The relation between emitter resistor $R_E$, $R_D/R_E$, is defined as the discrimination ratio D. Thus, the discrimination ratio D is a function of preselected passive components which are not affected by the absolute voltage level of one or more of the inputs. As shown in the subheading "Circuit Analysis," infra, any input to a transistor does not produce an output at the collector electrode thereof unless that input is within a fixed percentage ("D" percent) of the largest input to any other transistor. The input to transistors 20***a*, 20*b*, 20*c* . . . 20*n* is to the base electrode thereof and come from the amplifiers 13 for each sensor element. The output of each transistor is taken from output terminal 22*a*, 22*b*, 22*c* . . . 22*n*, respectively, in a manner described more fully hereinafter.

Silicon transistors produced by present technology generally have a reverse emitter-to-base breakdown voltage range of the circuit to less than 10 volts. Under these circumstances, a breakdown condition could exist whenever the difference between the junction node voltage ($e_n$) and any given input voltage to a given transistor exceeds the reverse breakdown voltage. (Although germanium transistors could be used in the circuit, they are not generally useful for high sensitivity circuits because of their higher leakage current ($I_{co}$) levels, even though their reverse breakdown voltage may be greater.) In order to increase the dynamic range of the circuit silicon diodes 21*a*, 21*b*, 21*c* . . . 21*n* are included in series with the base-emitter circuit of the transistor. For reasons described later herein, such diodes are preferably connected between the emitter electrode and the common nodal point N and, more specifically, between emitter resistor $R_D$, and ratio resistor $R_E$.

However, it is to be understood that such diode may be connected between the base electrode and the input thereto and still increase the dynamic range of the circuits. Addition of such diode in series with the base-emitter circuit modifies the absolute minimum threshold of the circuit by a factor proportional to the forward direction diode voltage drop ($V_f$) but this does not alter the basic action of the discriminator in any way. Such diode may be connected as shown in FIG. 3, or between the emitter electrode and the emitter resistor $R_D$. In the latter two instances, the forward direction diode voltage drop ($V_f$) will be slightly higher than in the base circuit location because the base currents which flow through the diodes are very small, whereas, when the diode is in series in the emitter, relatively higher emitter currents flow through the diodes. In any event, the variation of forward voltage drop of the diodes would not be more than a few hundred millivolts, and the effective threshold value remains about the same. The preferred location of the diode is as shown in FIG. 3 since this allows automatic electronic switching of discrimination fields into various size groups or sets. The diode thus performs a dual function in the discrimination circuit when connected in the emitter circuit.

ANALYSIS OF THE DISCRIMINATING FUNCTION OF THE BASIC CIRCUIT

The following analysis relates to FIG. 3 and assumes the absence of diodes 21*a*, 21*b*, 21*c* . . . 21*n*.

Assume an input on transistor 20*a* *only* of $el>V_{be1}$ and $<(+V_p-1)$, i.e., within the linear dynamic range. The emitter voltage of transistor 20*a* is then $el-V_{be1}$. The voltage at the junction of $R_D$ and $R_E$, a point common to all stages is $$\frac{R_E(e1-V_{be1})}{R_E+R_D}$$

Dividing through by $R_E$, this node voltage expression may be written as:

$$e_n=\frac{e1-V_{be1}}{1+R_D/R_E}$$

The ratio $R_D/R_E$ is defined as D, the discrimination ratio. Thus $$e_n=\frac{e1-V_{be1}}{1+D}$$

Finally, define a new input voltage $e'_1$ such that $$e_1'=(el-V_{be1})$$

(This may be thought of as the "effective" value of the input signal $e_1$ $$e_n=\frac{e_1'}{1+D}$$

The emitter current flowing in transistor 20*a* is, in this simple case, the emitter to ground voltage divided by the total series emitter resistance $R_D+R_E$, or $$\frac{e_1-V_{be1}}{(R_D+R_E)}=\frac{e_1'}{(R_D+R_E)}$$

Since currents from other transistor sources will generally be flowing in $R_E$, it is desirable to express each emitter current as a function of its own input only and the common node voltage $e_n$. Hence $$I_{e1}=\frac{(e_1-V_{be1})-e_n}{R_D}=\frac{e_1'-e_n}{R_D}$$

for $(e_1'-e_n)>0$; $I_{e1}=0$ for $(e_1'-e_n)\leqq 0$. The collector current is then $$I_{c1}=\frac{e_1'-e_n}{R_D(1+1/h_{fe})}=I_{e1},\ h_{fe}\gg 1$$

This equation holds regardless of the source of currents across $R_E$, although these currents must be taken into account in determining the value of $e_n$. A transistor is a unilateral current flow device. The expression for $I_{e1}$ shows that there is some minimum value of $e_n$, namely $e_1'$, which would make $I_{e1}$ equal to zero. ($e_n$, under the previous assumption of an $e_1$ input on transistor 20*a*, when all other transistor inputs are 0, equals $e_1'/1+D$.) The voltage at the base input of transistor 20*b*, or any other transistor, which would result in an $e_n$ of $e_1'$ is found from the following relationship:

$$e_n=\frac{R_E(e_2-V_{be2})}{R_D+R_E}$$

Solving for $e_2$:

$$e_2=e_n\frac{(R_D+R_E)}{R_D}+V_{be2},\ e_2=(1+D)e_n+V_{be2}$$

The voltage at the emitter of 20*b* is $$e2-V_{be2}=e2'=(1+D)e_n$$

$e_n$, however, equals $e_1'$, since this is the minimum value of $e_n$ that just makes $I_{e1}$ reach 0, and $I_{e1}$ must be zero as originally assumed, for the above analysis involving $e2$ to hold true. Thus $e2'=(1+D)e_1'$, for $I_{e1}=0$. This equation shows the result of basic discrimination action, i.e., an input $e2'$ at least $D\cdot e_r$ in other words$>(1+D)e_r$, where $e_r$ is any given reference level of any other input, or inputs, is the only input to product emitter current (and the only cause of current flow in $R_E$). Any value voltage input between $e_r$ and $(1+D)e_r$, that is, $$e_r<e_1'<(1+D)e_r$$

will continue to cause some emitter current to flow in the circuit of transistor 20*a*, and if any current flow beyond the detectable minimum is defined as a detected voltage input, then the above limits on $e_1'$ represent the double-input detection range (emitter current is also flowing in the transistor reference circuit over the $e_r$ to $(1+D)e_r$ range of $e_1'$). Thus the ratio of the maximum voltage to the minimum voltage that falls within the multiple-detection band is $$\frac{e_1'\ \text{max}}{e_r}=\frac{(1+D)e_r}{e_r}=(1+D)$$

D can have any positive value ($D=R_D/R_E$) greater than or equal to 0, but in a given application D is typically less than 1. Maximum and minimum voltage extremes of greater ratio than $1+D$ always result in the greater voltage being selected over the smaller. In the general case, all inputs could have some level of voltage present, and if all fall within the $1+D$ ratio band, all are detected. If there are some inputs $e_{min}$ such that $e_{max}/e_{min}$ is greater than $1+D$ then these inputs are not detected. If no inputs fall into the $1+D$ ratio band, (i.e. $e_{max}>(1+D)e_{min}$) then only $e_{max}$ is detected.

All of the above ratios involving the input voltage ratios, and the basic discrimination constant $(1+D)$ are with respect to the "effective" input levels $e_k' \pm e_k - V_{bek}$. The $V_{bek}$ acts as an increasing error-term as the actual input voltage drops to levels approaching this 0.5 v. to 0.7 v. typical level of $V_{be}$. As a practical matter, all $V_{be}$'s are inherently clustered closely together, so that the effect of $V_{be}$ is simply a negative constant which subtracts from any and all inputs $e_k$ to give $e_k'$ as the effective input level over which discrimination takes place. $h_{fe}$ variations of the transistor have little effect, as the base currents are quite small, even for low impedance voltage-source inputs, because of the emitter-follower action of each discriminator stage.

As is known, an operational amplifier has a relatively low output impedance. This characteristic, in conjunction with a constant current source may be used to eliminate the input threshold level. If desired, a constant current $I_d$ may be supplied from a source 70 between the operational amplifier and the discriminator as shown at 70 in FIG. 2 to give an input-offset of zero volts. Since the current $I_d$ is independent of signal voltage, a constant voltage drop across the effective coupling resistance (not shown) may be selected to cancel out the effects of emitter to base voltage drops of the discriminator transistors, diode forward voltage drops and the like. However, the constant current device does not affect the basic discriminator action.

OUTPUT TRANSFER CIRCUITRY AND AUTOMATIC SWITCHING

The basic circuit shown in FIG. 3 is incorporated into FIG. 4 (corresponding numerals being identified by prime numeral) in which additional circuitry is provided for sampling the output of the discriminators at any predetermined point of time, for a predetermined period of time, transfer of the largest output among the group, or the several outputs if two or more are within D% of each other to a utilization circuit or device. (In case two input signals are within D% of each other, the document is separated or otherwise identified for human scrutiny, if desired.) In addition, the circuit of FIG. 4 incorporates a switching matrix for automatically switching any given discriminator into and out of one or more predetermined discrimination sub-groups or fields. As will be described more fully hereinafter, 10, for example, discriminators could in one instance be programmed to select the largest voltage input from 10 inputs ($G=1$, $N=10$) i.e., to "discriminate" over a field of 10. Also, upon receipt of a command signal, the group might be required to discriminate over two fields of 5 each ($G=2$, $N=5$). In this case, voltages at opposite extremes of the dynamic range could be detected, if the high extreme were present in one set of 5's and the low extreme were present in the other set of 5. Likewise, another command from field program control 15 could request the 10 discriminators to be split into 5 fields of 2 each ($G=5$, $N=2$). In this case, each field acts as a differential pair, each voltage input "competing" against only one other input. Again, both outputs could be detected if they are within D% of each other, regardless of the absolute level thereof. Finally, the 10 group of 10 discriminators could be switched into 10 separate fields of one each, which is the so-called non-discrimination mode in which case any input is accepted so long as the input voltage level exceeds the absolute minimum threshold ($G+10$, $N=1$).

Dealing first with the output transfer circuitry, which is shown in FIG. 4*a*, it will be understood that there will be one such circuit similar to FIG. 4*a* at the output terminals of each of transistors **20*a*, 20*b*, 20*c*, 20*d* . . . 20*n***, the one shown in FIG. 4*a* being the one applied to transistor **20*a*. Preferably, as soon as any emitter current flows in a given transistor channel, a logical output level should be available to indicate the presence of a detected and discriminated input signal voltage. In the present case, the collector resistor $R_C$ has a relatively high value of resistance to serve as a clamp resistance for the collector circuit of transistor 20*a* and the base circuit of output amplifying transistor 25. That is, the large value of collector resistor $R_C$ prevents the leakage current of transistor 20*a* from biasing transistor 25 on. At the same time, a large value collector resistor $R_C$ serves as a base clamp for transistor 25** to keep its leakage current at a minimum.

Transistor 25 has its base-emitter circuit connected in shunt with the resistor $R_C$ with the output of transistor **20*a* being directly coupled to the base of transistor 25. With this connection, as soon as sufficient input current flows through transistor 20*a*, current begins to flow through the emitter-base junction of transistor 25 and, consequently, in the collector output circuit of transistor 25. The output taken from the collector circuit of transistor 25 is thus an amplified version of the signal at the collector of discriminator transistor 20*a***, and this output voltage is ground-referenced and totally isolated from the input circuit.

The collector circuit of transistor 25 includes a pair of series-connected resistors 26 and 27, the intermediate point 28 thereof serving as a take-off for a monitoring jack 29.

Rather than having the output voltage feed directly into the computer feed-in circuitry it is preferable to strobe the output circuit and set up a conventional flip-flop or storage register 30, if an input level has been detected by a given transistor discriminator channel. Thus, the collector circuit of transistor 25 includes a strobe transistor 31 wherein the emitter-collector circuit thereof is connected in series circuit with resistors 26 and 27. The base electrode of strobe transistor 31 is connected to a source of negative potential through a current-limiting resistor 32 and a strobe pulse from a strobe pulse source 33 is supplied to the base circuit of strobe transistor 31 through resistor 34.

During non-strobe, or quiescent condition, the strobe transistor 31 is turned on by the high-level of its base input. Any input signal to transistor **20*a* that is above the minimum threshold level thereof, or any level that survives the discriminiation process when other inputs are present on other channels wired into the same discrimination field, will cause transistor 25 to saturate. Since resistor 27 returns to ground through the collector-emitter circuit of transistor 31, the voltage level observed at a monitoring point 28 is proportional to the voltage drop across resistor 27 plus the saturation voltage of strobe transistor 31**.

When a strobe pulse is applied to the base of transistor 31, that transistor is turned off and an additional series resistance 36 is included in the output path which becomes a current source to the input of the register flip-flop trigger circuit 30. If transistor 25 is "ON" (an input level present) then the voltage at the monitor point 28 is substantially greater in value than the value of the voltage at the monitor point 28 in the absence of a strobe pulse. Thus, the time relationship between the strobe interval and the discriminator output signal is clearly shown at the monitor point so that a complete synchronization picture is presented at the monitor point for system calibration and maintenance purposes.

If there is no detectable input signal to transistor 20*a*, output transistor 25 is "OFF" and resistor 26 is connected into a near-open circuit in the collector end of transistor 25. Thus, during the absence of a strobe pulse, the voltage at monitoring point 28 is at or near ground level. When the strobe pulse is received, strobe transistor 31 is also cut off and the only voltage observed at the monitoring point 28 is the small back-biased voltage (a negative level) from the bias circuit of flip-flop 30. Thus, the timing position of the strobe pulses can also be observed at monitor point 28 even in the absence of detected input signals. FIG. 4*b* shows a series of waveform diagrams showing the timing for various input/output conditions that can exist in a repetitively pulsed system.

The storage flip-flop 30 must be periodically reset at some time after each strobe pulse if such flip-flop is to correctly represent the detected/undetected input signal-level condition that exists during each succeeding strobe pulse interval. Thus, a reset pulse is applied through reset terminal 37 for this purpose.

USE OF THE SAME DISCRIMINATOR CHANNEL CIRCUITRY IN A NUMBER OF FIELD COMBINATIONS

As described earlier herein, several field combinations of a 10-channel set of discriminators were listed as examples:

I. One field of 10.
II. Two fields of 5 each.
III. Five fields of 2 each.
IV. Ten fields of 1 each (i.e., non-discriminating mode).

As shown in FIG. 4, each discriminator channel is provided with a set of five diodes, 40*a*, 40*b*, 40*c*, 40*d*, and 40*e*, which electrically, individually correspond to diodes 21 shown in FIG. 3. The anodes of all five diodes are tied together at the non-emitter end of emitter resistor $R_D$. The field combination of all 10 channels in a common field is obtained by connecting the cathode of one diode (diode 40*a* and each corresponding diode in the emitter circuit of each succeeding channel) into a common bus 41 and a ratio resistor 42 (which corresponds in electrical function to ratio resistor $R_E$ of FIG. 3) and a control switch 43 to connect the remote end of ratio resistor 42 either to ground or to a source of reverse bias potential for the diodes 40. Switch 43 is preferably a solid-state transistor voltage control switch which is operated by a pulse applied to the base thereof. (Operation of such transistor switch circuit is similar to operation of strobe transistor 31.) The one field of 10 configuration is rendered active if control switch 43 is turned on. When the control switch 43 is off, bus 41 has no effect on the discrimination circuitry because all diodes connected to such bus are reverse-biased and no emitter current can flow in any of the connected emitter paths. Such reverse-bias condition holds over the entire dynamic range of input levels.

In a similar manner, to activate the two fields-of-five each combination, similar transistor switches 44 and 46 are activated by a control pulse applied thereto for that purpose which turns both switches on. It will be noted that each control switch connects a ratio resistor 47 and 48, respectively, to an effective ground level and each ratio resistor is in series with a bus connection 49 and 50, respectively, going to a total of 5 diodes in each set, one per channel. Thus, two independent sets of 5 each are activated when a control signal is applied to switches 44 and 46 and when switches 44 and 46 are not operated, all diodes in each set are reverse or back-biased. Similar wiring schemes proceed for the remaining examples of 5 fields of 2 each and the non-discriminative mode of 10 fields or channels of 1 each.

The number of combinations may be greatly extended observing the following rules:

(a) For every discriminator combination a given channel is involved in, there must be a diode available at each emitter resistor $R_D$. Additional capacity may be obtained by expander cards (e.g., additional diodes and switching circuitry) connected to terminal 51. That is, each discriminator channel may be controlled by additional circuitry merely by making proper plug-in connections and expander cards therefor.

(b) For every field within a given combination (such as the five fields of a five-field of two-each combination (10 total channels)) there must be a ratio resistor $R_E$ available and each ratio resistor $R_E$ (5 in this example) must connect to a control switch. All control switch inputs are tied together and activated by a common control signal.

(c) All diodes on a given emitter resistor bus must be back-biased except the diode connected to the bus that has been switched on. If all diodes in the channel are back-biased, then the channel is disabled.

(d) As a corollary of item (c) above, only one control signal input is activated at a time (although there can be exceptions to this rule) when "add-on" channels are sometimes switched into an existing field combination.

From the foregoing, it will be apparent that the discriminator detects one of a plurality of input signals if it is a selected ratio or percent above the remainder and such ratio is independent of the absolute level of input signals because passive components establish the discrimination ratio. Moreover, the circuit is highly versatile in accommodating substantially any code position configuration on a data sheet or document. For example, the inputs to the switches 43, 44, 46 etc. may be from a program so that substantially any combination of vertical, horizontal or area position code information may be discriminated. The sensors may be in banks of horizontal columns and vertical rows corresponding to substantially all of the possible information positions of a given data area, certain discriminator channels being turned "ON" while others are disabled as desired.

PUNCHED HOLE DETECTION

FIG. 5 shows a modification of the basic discriminator circuit wherein the basic circuit has been adapted for detection of signals derived from punched hole type documents wherein information ambiguity is substantially eliminated. In this case, instead of feeding sensor signals to the base circuit of a transistor in a given channel, the base is electrically grounded as at 60. Sensor signals $e_r$ from a conventional operational amplifier are coupled to the emitter electrode of transistor 62 (which corresponds to transistor 20*a* of FIG. 3) via a series connected zener diode 63, ratio resistor $R_E$, one of diodes 64 and emitter resistor $R_D$. In this case, transistor 62 operates as a grounded base transistor amplifier and responds only to negative inputs at the emitter input. Zener diode 63 may have any desired zener voltage to set the negative detection level. Voltage inputs less negative, or on into the normal positive range are not detected so that all positive or negative levels below the minimum threshold are ignored. It will be understood that the terms "negative" and "positive" are relative and used in conjunction with the type semiconductor element used in FIG. 5 and that such may be reversed for semiconductor elements of opposite conductivity types and reversal of diode connections. It will be appreciated the monitor point 28' in the output circuit will still present the time-synchronization information described above.

While there have been shown and described various embodiments of the present invention, it is to be understood that it is not intended to be restricted solely thereto but that it is intended to cover all modifications and equivalents thereof which would be apparent to one skilled in the art and which come within the spirit and scope of the present invention.

What I claim as my invention is:

1. A discriminator circuit for selecting from a plurality of input voltages at least one voltage having a selected ratio D greater in amplitude than the remaining input voltages comprising, a plurality of parallel transistors corresponding in number to the number of input voltages, each such transistor having base, collector and emitter electrodes, a collector load resistor for each of said transistors, a series emitter resistor $R_D$ for each of said transistors, a ratio resistor $R_E$ commonly connected in series with each emitter resistor $R_D$ with the common point of all emitter resistors and said ratio resistor defining a nodal point, with the ratio $R_D/R_E$ of emitter resistor $R_D$ to ratio resistor $R_D$ defining the discrimination ratio D, means applying said input voltages to the base electrodes of said transistors, respectively, a plurality of sets of silicon diodes, each diode of a set being connected in series circuit with an emitter electrode of said parallel transistors, respectively, and said nodal point, and output means connected to each collector, respectively, whereby the selected ratio D is a function of the ratio of the emitter resistance $R_D$ and said common resistor $R_E$ and is unaffected by the absolute voltage level of one or more of said input voltages and an output appears only on a collector electrode where the input voltage applied to the base thereof is at least within said selected ratio D above the remaining input voltage.

2. A discriminator circuit as defined in claim 1, including means for selectively controlling the conduction condition of said diodes.

3. A discriminator circuit as defined in claim 1, wherein said diodes operate as voltage controlled switches, said circuit including, a source of switching potential for said diodes, a pulse controlled switch for connecting said diodes to said source of switching potential, and a source of switching pulses for controlling the operation of said switch.

4. A discriminator circuit as defined in claim 1, including, a switching matrix for said sets of diodes for energizing selected ones of said transistors by biasing a selected diode of a set conductive.

5. A discriminator circuit as defined in claim 1, wherein said collector load resistor is of relatively large value, said output means including an output coupling transistor having its base-emitter circuit connected in parallel with said large resistor, the base of said output transistor being connected directly to the collector end of said collector load resistor, an output load resistor in the collector circuit of said output coupling transistor;

and means for coupling an output voltage from said output load resistor to a utilization circuit.

6. The discriminator circuit defined in claim 5, including means for scanning said output means.

7. The discriminator circuit defined in claim 6 wherein said scanning means includes a plurality of pulse operated switches in circuit with said output load resistance, there being one such switch for each output load resistor, and means for applying a train of pulses to said pulse operated switches.

8. The discriminator circuit defined in claim 7, including storage means for storing the signal at said output means following the scanning thereof.

9. The discriminator circuit defined in claim 1 wherein the input to said base electrode is from an operational amplifier, and including a source of constant current at said base electrode.

10. The discriminator circuit defined in claim 7 wherein said output load resistance comprises at least two series connected resistors, and including terminal means at the common point between said resistors from which a monitor output signal is taken.

References Cited

UNITED STATES PATENTS

| | | | |
|---|---|---|---|
| 2,757,286 | 7/1956 | Wanlass | 307—317 X |
| 2,840,726 | 6/1958 | Hamilton | 307—270 X |
| 3,092,732 | 6/1963 | Milford | 307—235 |
| 3,317,753 | 5/1967 | Mayhew | 307—255 X |

DONALD D. FORRER, Primary Examiner

J. D. FREW, Assistant Examiner

U.S. Cl. X.R.

307—244, 255, 270, 318

UNITED STATES PATENT OFFICE

CERTIFICATE OF CORRECTION

Patent No. 3,486,040 December 23, 1969

John V. McMillin

It is certified that error appears in the above identified patent and that said Letters Patent are hereby corrected as shown below:

Column 11, line 17, "$R_d$", second occurrence, should read -- $R_e$ --.

Signed and sealed this 27th day of October 1970.

(SEAL)
Attest:

Edward M. Fletcher, Jr.
Attesting Officer

WILLIAM E. SCHUYLER, JR
Commissioner of Patents